United States Patent [19]

Fanning

[11] 4,349,162
[45] Sep. 14, 1982

[54] DEVICE FOR RECEIVING AND PACKAGING A STRIP OF ELECTRICAL COMPONENTS

[75] Inventor: William J. Fanning, Glen Ellyn, Ill.

[73] Assignee: Western Electric Company, Inc., New York, N.Y.

[21] Appl. No.: 222,420

[22] Filed: Jan. 5, 1981

[51] Int. Cl.³ ............................................. B65H 75/00
[52] U.S. Cl. ..................................... 242/54 R; 53/430
[58] Field of Search ................... 242/54 R, 54 A, 67.2, 242/68.3; 53/3, 200, 253, 430; 29/427

[56] References Cited

U.S. PATENT DOCUMENTS

| | | | |
|---|---|---|---|
| 2,341,401 | 2/1944 | White | 242/54 A |
| 2,614,761 | 10/1952 | Camras | 242/68.3 |
| 2,904,272 | 9/1959 | Barrett | 242/54 A |
| 2,984,425 | 5/1961 | Thayer | 53/430 |

*Primary Examiner*—Leonard D. Christian
*Attorney, Agent, or Firm*—R. P. Miller

[57] ABSTRACT

A strip (11) of pairs of orthogonally projecting fragile terminals (14 and 16) with components (10) bonded therebetween is wound in a trackway (58) formed by a helical fin (57) extending from a cylinder (51). The cylinder (51) is mounted on a drum (52) that is intermittently driven by a constantly energized motor (36). Facilities (59) are provided to permit axial loading of the cylinder on the drum. A drive pin (67) arrangement provides a positive drive from the drum to the cylinder. The height of the helical fin is designed to be higher than the height of the strip of terminated components so that the confined strip of components may be transported without danger of damage.

2 Claims, 7 Drawing Figures

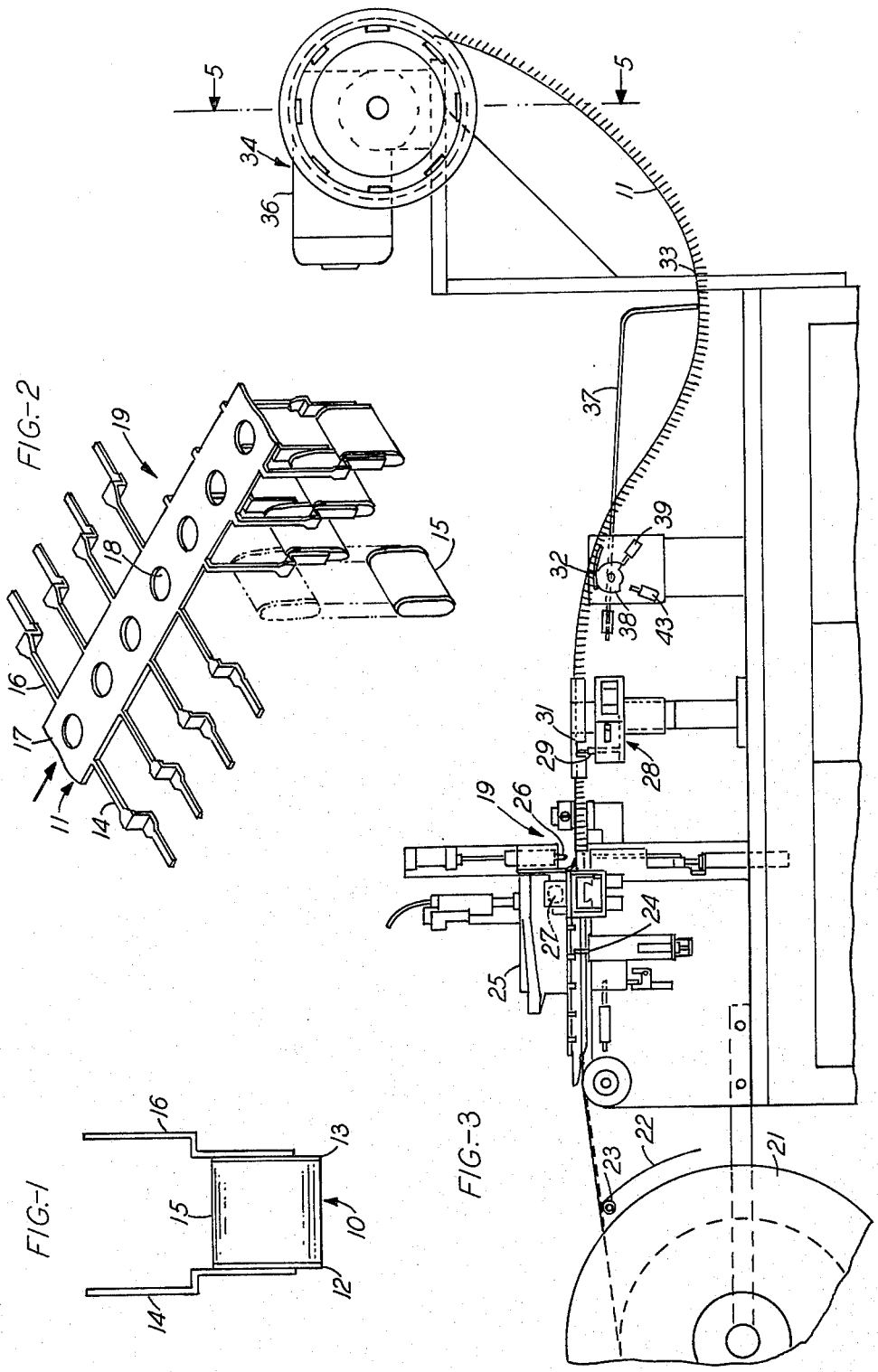

DEVICE FOR RECEIVING AND PACKAGING A STRIP OF ELECTRICAL COMPONENTS

CROSS REFERENCE TO RELATED APPLICATION

W. J. Fanning application Ser. No. 222,441, entitled "METHOD AND APPARATUS FOR BONDING TERMINALS TO ELECTRICAL DEVICES", filed on even date herewith and assigned to the Western Electric Company, Inc.

TECHNICAL FIELD

This invention relates to a device for receiving and packaging a strip of electrical components and, more particularly, to a takeup arrangement having a helical trackway for receiving a strip of projecting components and protecting the strip during subsequent handling, processing or shipment.

BACKGROUND OF THE INVENTION

In the afore-identified copending application Ser. No. 222,441, there is disclosed and described a method and apparatus for bonding terminals projecting from a carrier strip to electrical components, such as rolled metallized film capacitors. The end product is a carrier strip having orthogonally projecting pairs of thin terminals with capacitors bonded therebetween. Such strips of capacitors are subsequently transported to other manufacturing locations for further processing, such as encapsulating the capacitors within small plastic boxes so that the leads protrude from the boxes.

In other instances, the strips of capacitors may be fed through testing facilities and thereafter encapsulated within plastic jackets. Ultimately, the strips of capacitors are severed and the discrete terminated capacitors are either hand or machine inserted in printed circuit boards. During handling and subsequent transport of the strips of capacitors great care must be exercised to avoid crushing the thin capacitors.

In copending application Ser. No. 72,394, filed on Sept. 4, 1980, in the names of J. R. Meal and D. K. Sandmore and entitled "Method and Apparatus for Manufacturing Boxed Encapsulated Capacitors", now U.S. Pat. No. 4,268,942, there is shown and described another apparatus for securing strips of pairs of terminals to capacitors together with apparatus for boxing the capacitors. Further, copending application Ser. No. 72,372, filed Sept. 4, 1980, in the name of D. K. Sandmore and entitled "Method and Apparatus for Cutting and Racking Lead Frame Strips of Boxed Capacitors", now U.S. Pat. No. 4,270,424, shows and describes an indexable magazining device for receiving a strip of boxed capacitors manufactured by the apparatus shown in the Meal-Sandmore application.

U.S. Pat. No. 3,906,614 issued Sept. 23, 1975, to C. C. Rayburn, discloses a method of loading electrical components having radially extending pairs of leads into a carrier strip which is helically wound on a rotating drum. Initially, pairs of holes are formed in the carrier strip, and then the components are loaded by inserting each pair of leads into each pair of holes formed in the carrier strip. The strip of components may be subsequently wound onto a disposable reel having a spiral groove to accommodate the terminal leads while the component bodies protrude from the peripheral surface of the reel.

SUMMARY OF THE INVENTION

This invention contemplates, among other things, a packaging cylinder having a helical fin which forms a helical trackway for receiving a carrier strip having pairs of terminals projecting orthogonally therefrom, and components bonded between the pairs of leads.

More particularly, a strip of terminals and components is positively advanced toward the packaging cylinder which is intermittently rotated to take up the strip within the helical trackway. The strip is advanced in such a manner that the exposed surface of the strip engages the surface of the cylinder with the terminals and components extending radially from the surface of the cylinder. The height of the helical fin is selected to be greater than the height of the radially extending terminals and components. In effect, the helical fin forms a protective wall which extends along opposite sides of the wound strip of components.

Other features of the invention contemplate facilities for removably mounting the cylinder on a takeup drum which is intermittently operated following a number of incremental advances of the strip toward the cylinder and takeup drum. A drum drive pin and cylinder slot arrangement are provided to positively lock the cylinder to rotate with the takeup drum. A spring-loaded check is utilized to resiliently hold the cylinder from axial movement relative to the drum.

The use of the spring-loaded check and drum drive pin arrangement permits an attending operator to quickly load and unload a cylinder onto and from the drum. In addition, the cylinder is furnished with facilities for securing the leading and trailing ends of the strip to hold the strip within the helical trackway during removal and subsequent transport.

BRIEF DESCRIPTION OF THE DRAWINGS

Other advantages and features of the invention may be appreciated upon consideration of the following detailed description and accompanying drawings, wherein FIG. 1 shows an electrical device, such as a rolled metallized film capacitor, that may be attached to a carrier strip;

FIG. 2 is a perspective view of a strip of deformable metal having oppositely disposed pairs of terminal leads that are bent and bonded to end electrodes formed on a capacitor blank;

FIG. 3 is a front elevational view of an apparatus for bending and bonding the terminals to the capacitors to form a strip of capacitors which are wound and packaged by the instrumentalities of the present invention;

DETAILED DESCRIPTION

Figure 6:
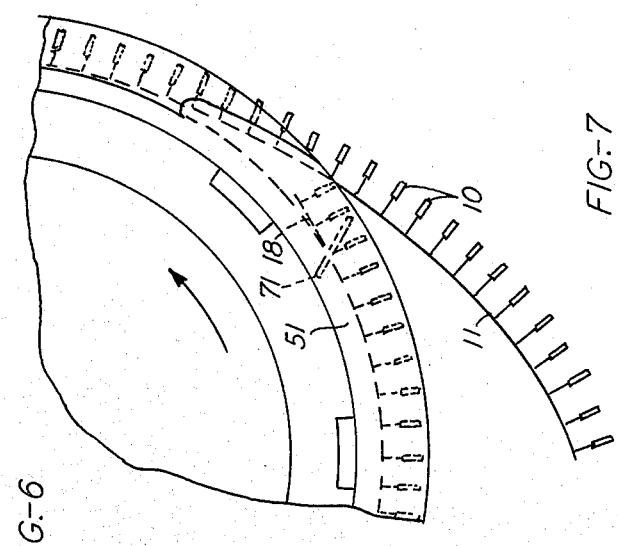
FIG. 6 is a side elevational view illustrating a portion of the cylinder and takeup drum and showing a lock pin for securing the leading end of the strip within the helical channel.

Referring to FIG. 1, there is shown a rolled metallized film capacitor 10 that, when attached to a terminal lead frame strip 11 (see FIG. 2), may be packaged by the apparatus of the present invention. A capacitor as shown in FIG. 1 includes a body or blank 15 of rolled metallized film, a pair of end electrodes 12 and 13 constructed of heat fusible metal and a pair of terminals 14 and 16. The assembled capacitor may be utilized as shown or coated with a plastic encapsulant, or it may be placed in a small plastic box. When boxed, the capacitor assembly may be placed in an insertion machine which functions to insert terminal leads 14 and 16 in spaced holes formed in a printed circuit board.

As described in the copending W. J. Fanning application, Ser. No. 222,441, which is hereby incorporated by reference, the terminal lead frame strip 11 is stamped in a press to provide a carrier strip 17 having pairs of oppositely extending terminals 14 and 16 and a series of index holes 18 adjacent to each pair of terminals. The lead frame strip 11 is advanced in incremental fashion to move and precisely position a pair of terminal leads 14 and 16 in an assembly area designated 19, whereat a capacitor blank 11 is advanced into proximity to the underside of the strip. Subsequent thereto, the positioned pair of terminal leads 14 and 16 are bent downwardly to press the ends of the leads against the end electrodes 12 and 13. Immediately thereafter the end sections of the terminals are heat fused to the end electrodes 12 and 13.

Referring to FIG. 3 for a more comprehensive consideration of the overall operation of the apparatus, there is shown a supply reel 21 having wound thereon convolutions of the terminal lead frame strip 11. In order to prevent entanglement of the terminal leads, a ribbon 22 of paper is interwound with the convolutions of the strip 11 during the initial winding of the strip onto the supply reel. When the strip 21 is unwound from the supply reel, the paper ribbon 22 is separated from the lead frame strip by feeding the paper ribbon over a guide roller 23 into a discharge hopper, not shown.

The lead frame strip 11 is incrementally advanced from the supply reel by moving a feed finger or pin 24 in a rectangular path so as to cyclically engage the feed finger with the strip within succeeding feed holes 18. Each pair of terminals 14 and 16 is moved into the assembly area 19 whereat capacitor blanks 15 are advanced from a vibratory hopper 25 into a positioning mechanism that functions to move a blank 15 into proximity of the underside of the strip 11. This operation is followed by the movement of a bending die or lead former 26 in a downward direction to bend the terminals 14 and 16 so that the end sections thereof engage with the end electrodes 12 and 13 on the capacitor blank.

Subsequent thereto, a pair of bonding devices are operated to move bonding electrodes toward and against the bent terminals 14 and 16, whereafter the application of electrical energy effectuates the bonding of the ends of the terminals to the positioned capacitor blank 15. The bond electrodes are not shown in the present application but are completely disclosed and described in the copending W. J. Fanning patent application. One of the air cylinders used to operate the bonding electrodes is designated by the reference numeral 27. Following the bonding of the capacitor to the terminals the subsequent advance of the strip 11 moves the terminated capacitor into a sizing or deflashing station 28 whereat a pair of shaping members 29 and 31 are moved to upset and reshape any flash that may have resulted from the previous bonding operation.

Following the sizing operation, the strip 11 is advanced over a guide shoe 32 to form a catenary-like loop 33, whereafter the strip is taken up by a winding device 34 driven by a normally energized motor 36. The nadir of the loop is sensed by an arm 37 which engages the upper side of the strip 11. The sensing arm is weighted to follow the loop formed in the strip, and when this loop drops down a predetermined amount, a cam 38 operates a switch 39 to impress an input on control circuit (see FIG. 7) to deenergize a magnetic brake 41 and energize a magnetic clutch 42 which are of commercial manufacture and generally shown in FIG. 4. The normally energized motor is thus rendered effective to drive the takeup device 34 to wind the strip 11, whereupon the loop 33 is moved upwardly to rotate the sensing arm and cam 38 a sufficient amount to operate a second switch 43 which functions to interrupt the energized control circuit for the motor 36. At this time the magnetic brake 41 is energized and the magnetic clutch 42 is deenergized to interrupt the transmission of power from the motor 36 to the takeup device 34.

Figure 4:
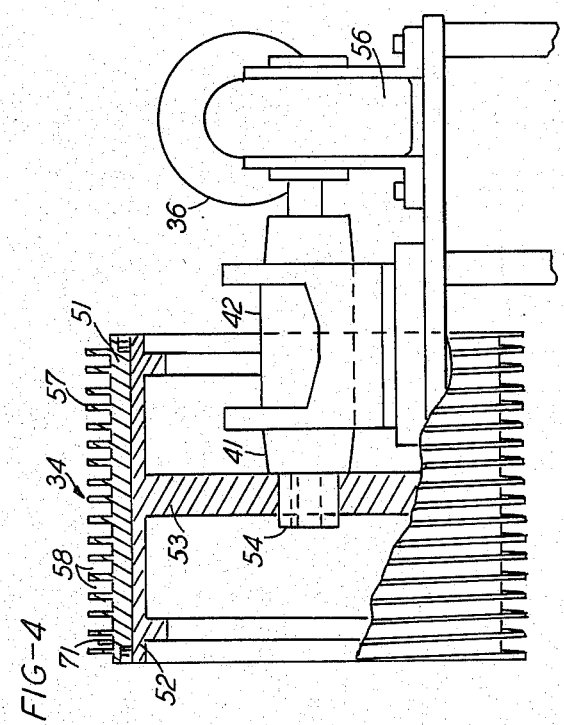
FIG. 4 is an end view partially cut away to show the construction of a takeup cylinder having a helical fin that defines a helix channel into which the strip of terminated capacitors is wound.
Figure 5:
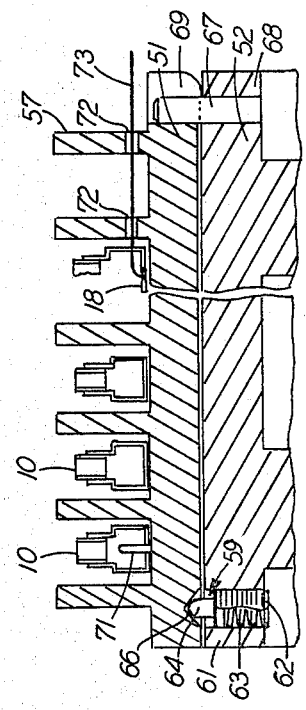
FIG. 5 is a sectional view taken along line 5—5 of FIG. 3 showing devices for holding the cylinder on a takeup drum together with the construction of the helical fin to form protective channels for receiving the strip of capacitors.

Turning now to a detailed consideration of the takeup device 34 and referring to FIG. 4, there is shown a cylinder 51 mounted on a drum 52 which, in turn, is secured to a hub 53 that is keyed to a drive shaft 54. Drive shaft 54 is driven by the motor 36 when the magnetic brake 41 is deenergized and the magnetic clutch 42 is energized. A suitable gear reduction mechanism 56 is interposed between the drive motor and the drive shaft 54. The cylinder 51 has a thin, but rigid, metal rib or fin 57 projecting from the peripheral surface thereof. The fin 57 is formed as a helix about the periphery of the cylinder to provide a helical trackway or channel 58 for receiving the strip 11 with the bonded capacitors 15. The height of the fin 57 is designed to be greater than the height of the strip 11, the terminals 14 and 16 and the capacitor 15 as shown in FIG. 5. The terminals 14 and 16 are made of thin metal stock and are relatively fragile, and there is great danger that the terminals will be bent during subsequent handling or processing of the strip of capacitors. However, with the strip of capacitors nested or confined within the channel defined by the rigid fin 57 the possibility of damage is alleviated.

The cylinder 51 is mounted on the drum 52 so that the cylinder may be easily removed and replaced with another cylinder. More particularly, the cylinder 51 is held from axial movement on the drum 52 by one or more spring-loaded pin checks 59. Only one of the pin checks 59 is shown in FIG. 4, but it is understood that several may be placed about the periphery of the drum 52. The pin checks 59 are mounted in threaded bores formed in a flange section 61 of the drum 52. Each check 59 includes a threaded sleeve 62 containing a spring 63 which engages and urges a pin 64 into an indentation 66 formed in the inner peripheral surface of the cylinder 51.

The cylinder 51 is held to rotate with the drum 52 by one or move drive pins 67 projecting from another flange 68 of the drum 52. Each pin 67 projects into an edge slot 69 formed in the cylinder 51.

The leading end of the strip 11 is held within the left-hand channel shown in FIGS. 4 and 6 by an anchor pin 71 embedded in the cylinder 51. The pin 71 projects angularly from the surface of the cylinder as shown in FIG. 6. At the time of start up, the attending operator will grasp the leading end of the strip 11 and position the strip in the left-hand channel with the pin projecting through the first or second feed hole 18 formed in the strip 11. Upon completion of the winding of the strip in the helical channel 58, the strip is severed and the trailing end is secured within one of the right-hand sections of the helical channel.

Referring to FIG. 5, it will be noted that the right-hand sections of the fin 57 are provided with aligned holes 72 through which may be passed a wire 73. The end of the wire 73 is passed through a trailing feed hole 18 and twisted to secure the strip to the wire. The wire 73 is passed through the hole 72 and wrapped around the outer right-hand convolution of the helical fin 57.

Referring again to FIGS. 3 and 7 for a consideration of the selective operation of the motor 36, it will be recalled that the movement of the arm 37 in a downward direction rotates the cam 38 in a clockwise direction to close the switch 39. Upon closure of the switch 39, a relay 76 is energized through normally closed switch contacts 43. Energization of relay 76 is accompanied by closure of contacts 76-1 to complete a locking circuit for the relay. Relay 76 also closes contacts 76-2 to apply energizing current to the clutch 42. At the same time, relay 76 is effective to open contact 76-3 to deenergize a circuit to interrupt the energizing current applied to the magnetic brake 41.

With the brake 41 deenergized and the clutch 42 energized, the motor 36 is rendered effective to drive the takeup device 34. The loop 33 will be drawn up by the advance of the strip 11 so that the arm 37 rotates the cam 38 in a counterclockwise direction. Eventually the cam 38 will operate the switch 43 to interrupt the energizing circuit to the control relay 76 thereby deenergizing the clutch 42 and energizing the brake 41.

Figure 7:
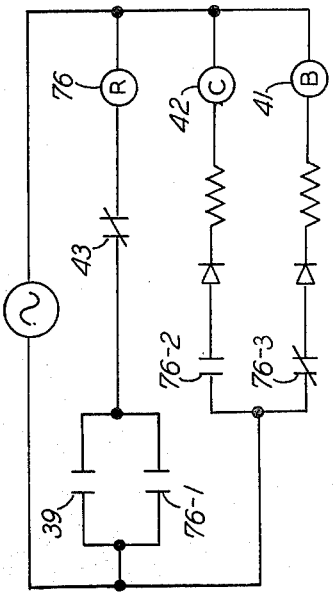
FIG. 7 is a diagram of a circuit for controlling the intermittent operation of the takeup drum.

The control circuit shown in FIG. 7 is for purposes of illustrating one means for controlling the operation of the motor 36. A preferred manner of control is set forth in the copending W. J. Fanning application wherein the operation of the switches 39 and 43 are utilized as inputs to a programmable controller or sequencer.

When a predetermined amount of strip 11 is wound on the takeup device, the attending operator will sever the strip and secure the trailing end of the strip by the use of the securing wire 73. The operator grasps the left-hand convolution of fin 57 and axially pulls the cylinder so that the pin checks 59 are depressed allowing for the removal of the cylinder from the drum 52.

Though the principal embodiment of the invention is described with respect to a strip of capacitors, it is to be understood that strips of other components may be wound and packaged by the apparatus of the present invention. It may be appreciated that the wound strip of components is nested and confined within walls defined by the helical fin 57, thus alleviating possibilities of damage to the packaged strip during subsequent processing or transport.

What is claimed is:

1. An apparatus for receiving and storing a strip with spaced, projecting pairs of terminals, each pair of which is secured to an electrical device, which comprises:

a drum having a series of bores formed in the peripheral surface in the vicinity of a first end of the drum;

a cylinder slidably mounted on the drum with a series of indentations formed on the inner surface and spaced apart to align with the bores in the drum;

a series of resilient biased pin checks mounted in said bores and having sections projecting into said indentations for releaseably holding said cylinder on said drum;

said cylinder having a series of slots formed to extend inwardly from an edge of the second end of said cylinder;

drive pins mounted in the vicinity of the second end of said drum and extending into said slots formed in said cylinder;

a fin projecting from the outer surface of said cylinder and forming a continuous helix about the axis of said cylinder to form a helical channel for receiving the strip of terminals and electrical devices, said fin being of a height greater than the height of the strip and the projecting terminals and electrical devices; and means projecting from said cylinder into the helical channel for anchoring a forward end of said strip to said cylinder.

2. An apparatus as defined in claim 1, wherein said anchoring means projects into a channel at a first end of the cylinder, and the fins adjacent the opposite end of the cylinder are provided with aligned holes to receive a wire for securing a rearward end of said strip within the helical channel.

* * * * *